United States Patent [19]

Gianella

[11] Patent Number: 5,023,194
[45] Date of Patent: Jun. 11, 1991

[54] METHOD OF MAKING A MULTICOLLECTOR VERTICAL PNP TRANSISTOR

[75] Inventor: Piccolo G. Gianella, Saratoga, Calif.

[73] Assignee: Exar Corporation, San Jose, Calif.

[21] Appl. No.: 154,832

[22] Filed: Feb. 11, 1988

[51] Int. Cl.⁵ ............... H01L 21/33; H01L 21/36
[52] U.S. Cl. ............................... 437/31; 437/27; 437/28; 437/55; 357/36
[58] Field of Search ............ 437/27, 31, 63, 28, 437/54, 55; 357/34, 22 D, 30 R, 43, 36; 148/DIG. 86, 87

[56] References Cited

U.S. PATENT DOCUMENTS

| | | | |
|---|---|---|---|
| 3,312,882 | 4/1967 | Pollock | 357/36 |
| 3,488,564 | 1/1970 | Crafts | 357/36 |
| 3,665,266 | 5/1972 | Drozdowicz et al. | 357/36 |
| 3,912,555 | 10/1975 | Tsuyuki | 437/54 |
| 4,038,680 | 7/1977 | Yogi et al. | 357/34 |
| 4,412,376 | 11/1983 | De Bar et al. | 357/34 |
| 4,458,158 | 7/1984 | Mayrand | 437/55 |
| 4,599,631 | 7/1986 | Tsuzuki | 357/34 |
| 4,733,287 | 3/1988 | Bower | 357/34 |

FOREIGN PATENT DOCUMENTS

| | | | |
|---|---|---|---|
| 0004787 | 1/1977 | Japan | 357/34 |
| 0023471 | 2/1983 | Japan | 357/43 |
| 0149163 | 8/1985 | Japan | 357/36 |
| 1298053 | 11/1972 | United Kingdom | 357/36 |

OTHER PUBLICATIONS

"Low Power Line Repeater", Paul C. Davis, et al., IEEE Journal & Solid State Circuits, Feb. 1979, p. 109, et seq.
Exar Linear Design Manual, pp. 3-11 et seq.
"First ADI CB Process Part is High-Speed 12-Bit DAC", Electronic Engineering Times, Monday, Sep. 7, 1987.
David and Moyer, Bell Labs, Int. Electron Devices Mtg., Washington, DC., Dec. 4-6, 1972.
"A New Complementary Transistor Structure for Analog Integrated Circuits", Takamaro Kikka, et al., 1980, IEEE, p. 65.
"200-MHz Transistors Spawn Fast Analog Chips", Dennis Monticelli, et al., Electronic Design, Aug. 21, 1986.

Primary Examiner—Brian E. Hern
Assistant Examiner—Tom Thomas
Attorney, Agent, or Firm—Townsend and Townsend

[57] ABSTRACT

A vertical semiconductor device having a plurality of vertical active regions and a method for manufacturing such a vertical semiconductor device. In the preferred embodiment, a vertical multicollector pnp transistor is formed by disposing a plurality of n type epitaxial layers over a bottom p type substrate. Each epitaxial layer has a plurality of collector regions formed therein. The collector regions are connected using a single diffusion step to form vertical collectors for the pnp transistor. The base is formed from the epitaxial layers and the emitter is formed using a separate implant or diffusion step. Vertical isolation regions are formed contemporaneously with the vertical collectors. The resulting pnp transistor has vertical collectors and isolation regions formed with less silicon, fewer diffusion steps, and more precise and reduced dimensions.

3 Claims, 5 Drawing Sheets

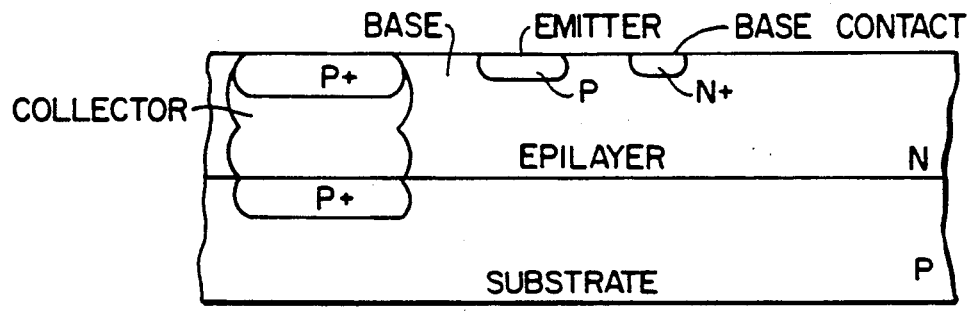
FIG._1A. PRIOR ART
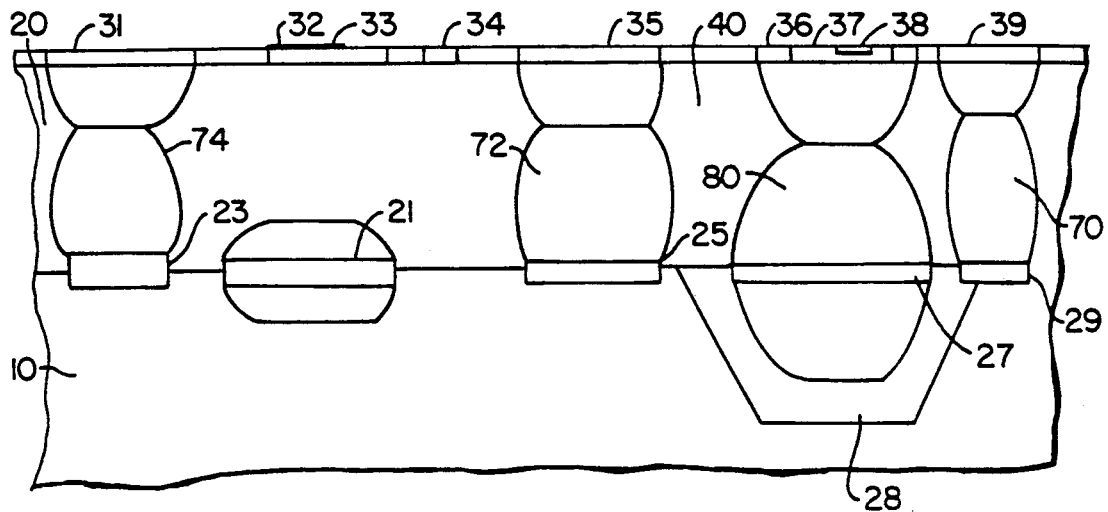
FIG._1B. PRIOR ART
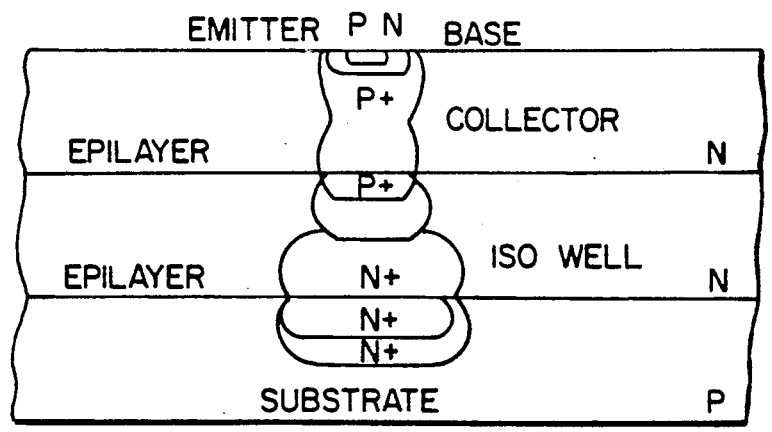
FIG._1C. PRIOR ART FIG._2.
FIG._3.
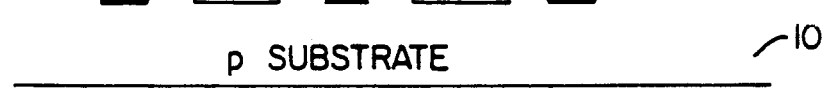
FIG._4.
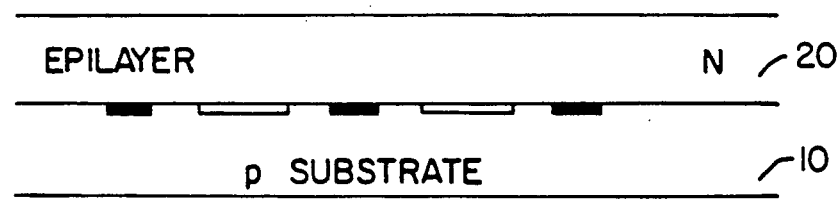
FIG._5.
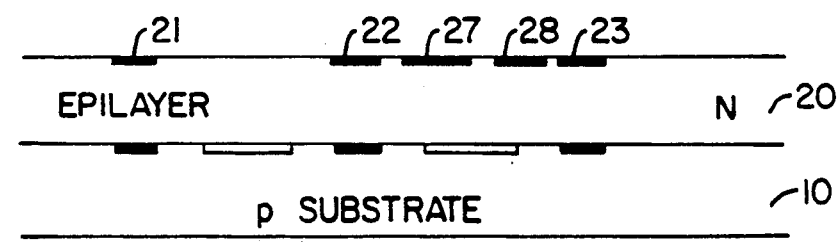
FIG._6.
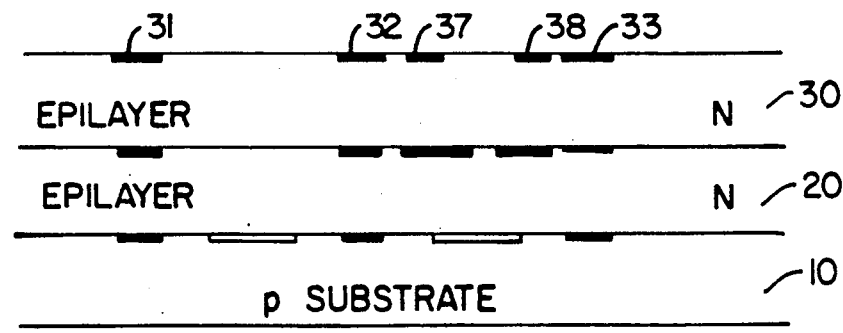

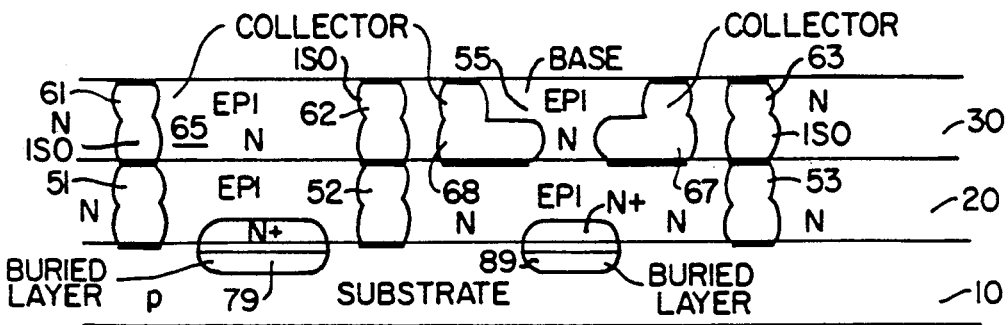
FIG._7.  NPN 100 TRANSISTOR    200 PNP TRANSISTOR
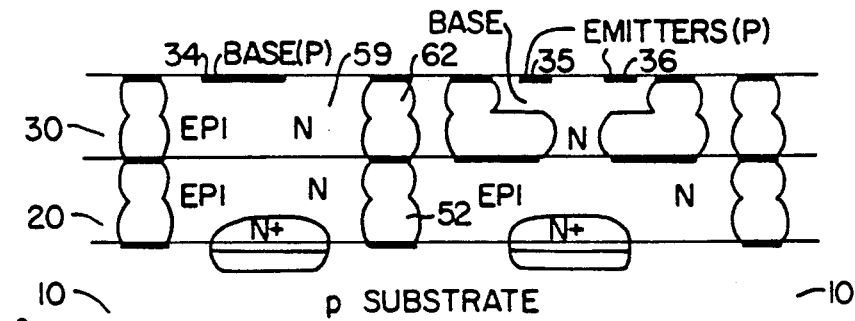
FIG._8.
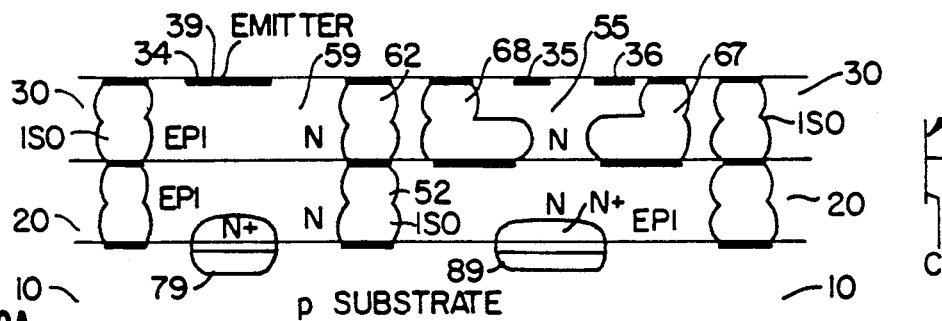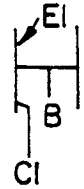
FIG._9A.
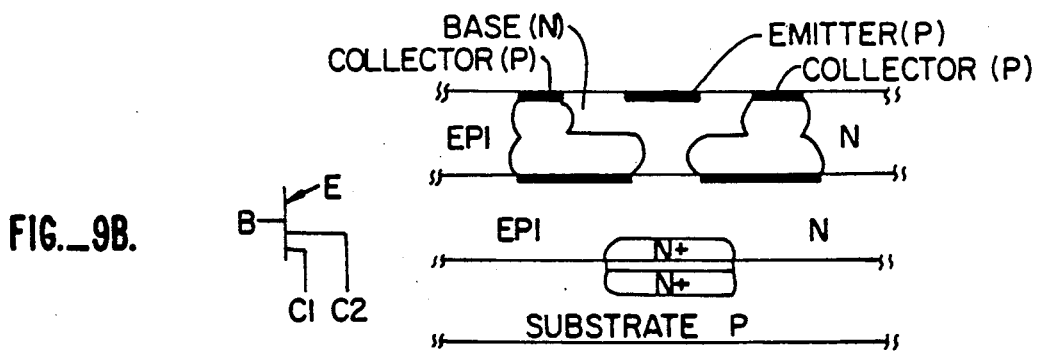
FIG._9B.

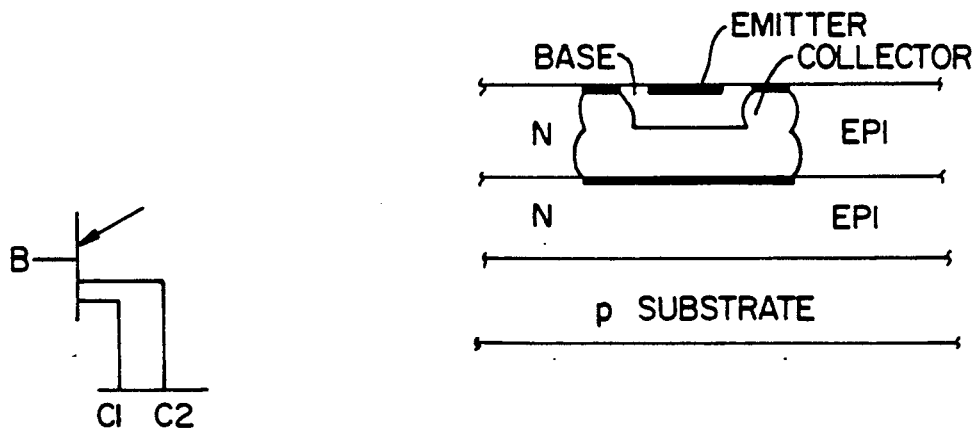
FIG._9C.
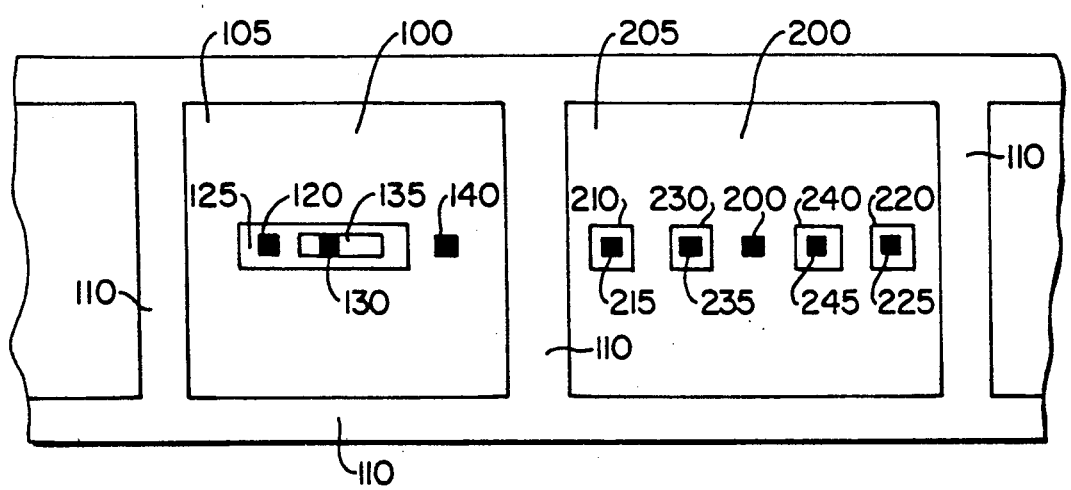
FIG._11.

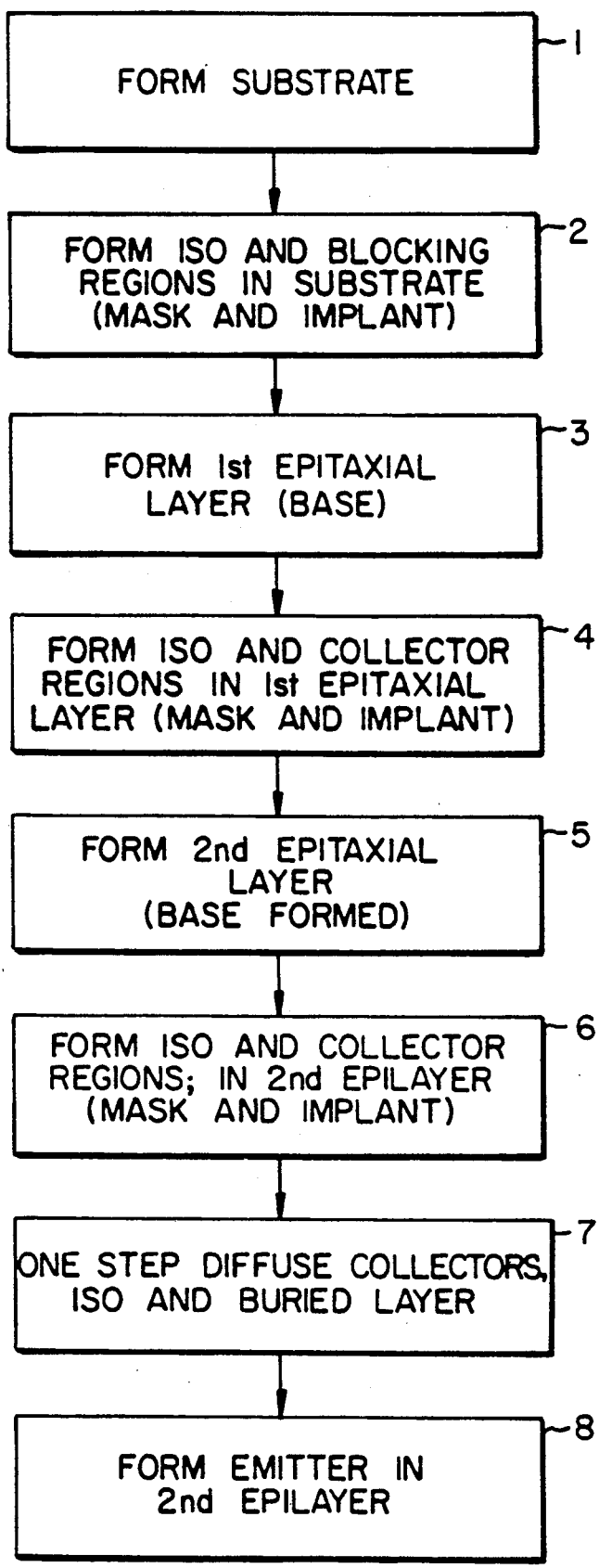
FIG._10.

METHOD OF MAKING A MULTICOLLECTOR VERTICAL PNP TRANSISTOR

BACKGROUND OF THE INVENTION

This invention relates to semiconductor devices. In particular, the invention relates to a multicollector vertical pnp transistor and to a method for fabricating a vertical semiconductor device using a minimum amount of material and diffusion steps.

The need for vertical pnp transistors having electrical performance similar to that of vertical npn transistors at high frequencies and medium voltages in analog applications has been known to circuit designers for several years. Unfortunately, attempts to fabricate vertical pnp transistors have not proven totally satisfactory.

For example, the lateral pnp transistor is known to have low current capabilities, poor response at high frequencies, and large dimensions.

It has also been found possible to construct a substrate pnp transistor as shown in FIG. 1A. Although this transistor has good current and frequency characteristics, the substrate actually grounds the pnp collector. As a consequence, the substrate pnp transistor encounters limited application. In addition, substrate type pnp transistors use a low concentration material for the substrate-collector, resulting in low gain for the device.

Previously fabricated vertical collector pnp transistors also suffer from several drawbacks. One example of a vertical collector pnp transistor is shown in FIG. 1B. As shown in that example vertical collector pnp transistors have been characterized by large dimensions resulting in inefficient use of silicon. As a result, high frequency response characteristics for this device have been less than desirable. In addition deep diffusion of an n well below the p collector is required to isolate the p collector from the p substrate. Moreover, fabrication of the vertical collector pnp transistor requires at least three diffusion steps. Which are costly and time-consuming processes.

A paper by Davis and Moyer, Bell Labs, Int. Electron Devices Mtg, Washington D.C., Dec. 4-6, 1972 teaches a process for making a vertical collector pnp transistor involving the use of two epitaxial layers. FIG. 1C illustrates this device. A single vertical collector is formed in two epitaxial layers and is isolated from the p substrate by a diffused buried region. However, the technique taught by Davis and Moyer requires a minimum of four diffusion steps to form a one collector device and was not adapted for forming multicollector devices or vertical devices having a plurality of vertical conductive regions. Moreover, because the device uses a highly doped n+ base formed in a high concentration p+ collector, the transistor has a low collector to base breakdown voltage.

The only other uses of multiple epitaxial layers in connection with transistor devices known to applicant have been limited to forming isolation regions for multidevice systems.

Thus, what is needed is a vertical pnp structure and a method for fabricating a vertical pnp structure that will meet the heretofore unmet needs of the prior art. In particular, what is needed is a method of fabrication that results in a multicollector vertical pnp transistor that exhibits good gain at high current levels, has a good high frequency response and has a smaller size relative to prior art devices. A high breakdown voltage is also a desirable objective. Fabrication steps for such a device should reduce wasted materials and require a minimum number of diffusion steps.

SUMMARY OF THE INVENTION

In accordance with the invention, there is provided a vertical semiconductor device having a plurality of vertical conductive regions and a method for manufacturing such a vertical semiconductor device using a minimum number of diffusion steps. In the preferred embodiment, a vertical multicollector pnp transistor is formed by disposing a plurality of n-type epitaxial layers over a bottom p type substrate. Each epitaxial layer has formed therein a plurality of collector regions which are connected to form multiple vertical collectors using a single diffusion step. The epitaxial layers are used to form the base of the device and a second diffusion step is used to form the emitter. A vertical semiconductor device is formed having less wasted silicon, relatively high breakdown voltages, and smaller and more precise dimensions.

BRIEF DESCRIPTION OF THE DRAWINGS

FIGS. 1A, 1B and 1C are cross-sectional views of pnp transistors in accordance with the prior art.

FIGS. 2-9A show one embodiment of the invention as it appears during successive fabrication stages.

FIG. 2 is a cross-sectional view of a bottom substrate.

FIG. 3 is a cross-sectional view of the bottom substrate with a plurality of conductive regions disposed therein.

FIG. 4 is a cross-sectional view showing a first epitaxial layer disposed on top of the substrate.

FIG. 5 is a cross-sectional view of the substrate and the epitaxial layer with a plurality of p regions disposed in the epitaxial layer.

FIG. 6 is a cross-sectional view showing a second epitaxial layer overlaying the first epitaxial layer.

FIG. 7 is a cross-sectional view showing a plurality of conductive regions disposed within the second epitaxial layer.

FIG. 8 is a cross-sectional view showing the invention after the regions have been selectively interconnected to form a multicollector vertical pnp transistor.

FIGS. 9A, 9B, and 9C are alternative embodiments of the invention showing various forms of a multicollector vertical pnp transistor and a paired npn transistor.

FIG. 10 is a block flow diagram showing the various stages in the process for making a pnp transistor having multiple vertical collectors in accordance with the invention.

FIG. 11 is a top view showing the pair of npn-pnp transistors depicted in FIG. 9A.

DETAILED DESCRIPTION OF THE INVENTION

A method for fabricating a multicollector vertical pnp transistor is described herein and more generally, a method for fabricating vertical semiconductor devices having multiple vertical conductive regions. The invention will be described first by reference to prior art techniques for fabricating vertical pnp transistors. Thereafter, the method of fabricating the present invention and the appearance of the invention during successive fabrication steps will be discussed. The advantages and benefits of the invention over the prior art will become apparent to one skilled in the art.

Refer again to FIG. 1A which shows a substrate collector pnp transistor. Although this transistor uses the epitaxial layers as the base and has other desirable characteristics as previously discussed, the collector is grounded and therefore the device has limited application and low gain.

Refer again to FIG. 1B which shows a cross-sectional view of a vertical pnp transistor with a complementary npn transistor fabricated according to the prior art. The fabrication process for the complementary transistor pair (shown in FIG. 1B) is as follows: Into a p substrate 10 is imposed a first n buried layer 28. The n buried layer 28 is positioned under the base region of the to be formed pnp transistor, and is formed by phosphorus ion implantation to a depth of about 15 $\mu$m. Next a second n buried layer 21 is formed under the to be formed npn transistor by antimony diffusion to a depth of 8 $\mu$m. Next a p buried layer 27 is formed in the first n buried layer by boron diffusion. Additional p buried layers 23, 25, and 26 are also formed in the p substrate 10 to isolate the pnp and npn devices from each other.

Referring still to the process for fabricating the device shown in FIG. 1B, an n type epitaxial layer 20 is grown on the substrate surface 10. Silane epitaxial growth is used to neglect the out diffusion of boron during the growth. Next boron ions are implanted in the epitaxial layer to form the pnp collector 36 and to form additional isolation regions 31, 35, and 39. The pnp base 37 is formed by phosphorus ion implantation with an acceleration energy of 50 keV. Next the base 32 of the npn transistor is formed by boron diffusion. Next the emitter 38 of the pnp transistor is formed by boron diffusion. Finally, the emitter 33 of the npn transistor is formed by phosphorus diffusion. Thus, there is formed a complementary npn and pnp transistor pair as shown in FIG. 1B. The foregoing discussion is a summary of the article entitled "A New Complementary Transistor Structure for Analog Integrated Circuits", Takamaro Kikka, et al., 1980 IEEE. pg. 65; see also "200-MHz Transistors Spawn Fast Analog Chips", Dennis Monticelli, et al., Electronic Design, Aug. 21, 1986; and see "Low Power Line Repeater", Paul C. Davis et al., IEEE Journal & Solid State Circuits. Feb. 1979, pg. 109, et seq.

Several of the disadvantages of forming the complementary npn-pnp transistor pair according to the above fabrication method can be noted. First, the vertical pnp collector has to diffuse outwardly in the lateral direction as it diffuses vertically, necessitating the use of an undesired amount of epitaxial material and silicon. In addition, four diffusion steps are employed which are costly and time-consuming. Further, the heavy out diffusion of the pnp collector, shown by regions 27, 80, 36, and 81, makes it difficult to precisely determine the base width for the pnp base, causing degradation of performance at high frequency. Further, in order to isolate the pnp collector regions 27 and 81 from the p substrate, the prior art technique requires the deep diffusion of an n well 28 below the p collector.

Refer again to FIG. 1C which shows a single vertical collector pnp transistor formed using two epitaxial layers as taught by Davis and Moyer. Their technique suffers from the following drawbacks when applied to forming multicollector vertical pnp transistors. First, it is believed that both the base and the collector of the device shown in FIG. 1c are high concentration regions which will result in a low collector to base breakdown voltage (BVcbo). Davis and Moyer indicate collector to base breakdown voltages of from 12 to 56 volts. A BVcbo within this range is unacceptable in most analog applications which require a BVcbo exceeding 45 volts in order to provide a required collector to emitter breakdown voltage (BVceo) of 15-25 volts. Since BVcbo is about 3 times BVceo, a BVcbo of 45 volts is needed to provide the requisite BVceo for medium voltage applications.

A similar problem of low breakdown voltage between the p+ collector and the n+ isolation region arises because these areas are adjacent high concentration regions.

Further, it is not practical to simply "split" the single collector to form a multiple collector device. To fabricate a multicollector device using the disclosed technique requires fabrication of a plurality of single collectors and a corresponding increase in silicon usage.

Another drawback of the single vertical collector fabrication method is that the isolation region must diffuse all the way to the substrate from the first epitaxial layer. This leads to undesired lateral diffusion of the isolation region and a corresponding increase in silicon.

In addition, the process requires separate diffusion steps for forming each of the collector, base, and emitter regions for the transistor.

The present invention overcomes the problems attending the prior art devices. FIGS. 2-9C show embodiments of the invention in various stages of fabrication. FIG. 10 shows a flow diagram of the steps for forming a vertical multicollector device according to the inventions. The fabrication steps will be discussed first to provide an appreciation of the specific advantages provided by the invention.

Refer now to FIG. 10.

The first step in fabricating the invention requires formation of a p type substrate.

Step two requires forming conductive regions in the substrate. In particular, isolation regions and buried layer regions may be formed in the substrate. These regions can be formed by ion implant or by diffusion. The isolation regions and buried layer regions will be formed in spatial locations that are suitable to the particular design considerations.

Referring still to FIG. 10, step three requires forming an epitaxial layer over the substrate after the regions have been formed in the substrate. The epitaxial layer is typically of a type opposite the substrate; hence, n type in this particular embodiment of the invention.

The next step, step four, requires forming conductive regions in selective spatial locations in the newly-formed first epitaxial layer. The conductive regions are multiple collector regions in the preferred embodiment and isolation regions in case multiple devices are to be formed. Both the collector regions and the isolation regions are of the same type as the substrate. The isolation regions are formed over the isolation regions that were formed in the p substrate. Typically, the collector regions are formed within the bounds of two isolation regions and are implanted to underlie where the final pnp collector contacts will be located on the surface of the device. The collector regions should be configured with necessary lateral dimensions to provide desired current handling capability. The isolation regions and the collector regions may be formed either by ion implant or by diffusion as is desired. The thickness of the epitaxial layer and the dimensions and type of collector should be chosen to meet voltage and current handling requirements.

Step five requires formation of a second epitaxial layer overlaying the first epitaxial layer. The second epitaxial layer is an n type layer like the first epitaxial layer, and in this layer the top collector and isolation regions will be formed. The base of the device is now formed completely from the first and second epitaxial layers without the need for a separate diffusion step.

Referring still to FIG. 10, in the next step six, top isolation and collector regions are formed in the second epitaxial layer over the corresponding regions in the first layer. The top collector regions may have a lateral dimension that is narrower than the lateral dimension of the corresponding buried collector region.

Step 7 comprises diffusion of the collector and isolation regions together. Diffusion is used to interconnect the regions into multiple vertical isolation and collector regions. By using high concentration regions for both the collectors and the isolation regions, aligned regions may be connected using a single diffusion step. During diffusion, the collector regions buried in the first epitaxial layer will diffuse up to interconnect with the collector regions diffusing down from the top epitaxial layer to form multiple vertical collectors. Also, the isolation regions in the substrate, first layer and second layer will diffuse up and down to form vertical isolation regions. In this way, a semiconductor device having desired vertical conductive regions may be formed requiring a minimum number of diffusion steps and a minimum of unwanted lateral diffusion. After completion of the diffusion step, the collectors are completely formed.

Step 8 requires formation of the emitter regions in the top epitaxial layer by ion implant or by diffusion example. Conventional oxide cover, openings for contacts, and metallization steps would complete the fabrication process.

Refer now to FIG. 2 through FIG. 9C which depict the appearance of the substrate and the epitaxial layers and the various regions during various fabrication steps for several embodiments of the invention.

Refer now to FIG. 2 which shows a single p type substrate 10.

Refer now to FIG. 3 which shows the p substrate 10 with a plurality of regions 11, 12, 13, 70, and 80 disposed therein. Shown in FIG. 3 are three isolation regions 11, 12, and 13 and two buried layer regions 70 and 80. The isolation regions are typically of a conventional high concentration p type material, whereas the buried layer regions would be of an n type material.

Refer now to FIG. 4 which shows the substrate 10 having the plurality of regions disposed therein and a first epitaxial layer 20 overlaying the substrate. The first epitaxial layer 20 is an n type material in the preferred embodiment.

Refer now to FIG. 5 which shows the first epitaxial layer 20, the substrate 10, and a plurality of conductive regions disposed in the first epitaxial layer 20. The regions include isolation regions 21, 22, and 23 and a plurality of collector regions 27 and 28. These regions are of p type material in the preferred embodiment. Further, these regions are disposed in specific spatial locations to facilitate diffusion into corresponding regions disposed in the substrate and in overlying layers formed later. For example, isolation regions would be located directly over each other vertically in the preferred embodiment. Similarly, collector regions will be located directly over each other vertically ("aligned"). In addition, the sizes and the shapes of the conductive regions can be chosen in accordance with design requirements, e.g., gain for the semiconductor device being fabricated at a given current.

Referring now to FIG. 6, there is shown a second epitaxial layer 30 overlaying the first epitaxial layer 20. The second epitaxial layer 30 is an n type material and is disposed directly on top of the first epitaxial layer 20. The second epitaxial layer will normally be of the same material as the first epitaxial layer.

Referring still to FIG. 6, the second epitaxial layer 30 has disposed therein a plurality of conductive regions, including isolation regions 31, 32, and 33 and collector regions 37 and 38. The isolation regions and collector regions are of a p type material.

Refer now to FIG. 7 which shows the foregoing device after it has undergone a diffusion step. Shown in FIG. 8 are fully-diffused vertical isolation regions 51,61; 61,62: and 53,63. The isolation regions separate npn transistor 100 and a pnp transistor 200.

Also shown are vertical collector regions 67 and 68 in pnp transistor 200. The base 55 of transistor 200 is formed from the second epitaxial layer 30. A collector 65 for the npn transistor 100 is formed from the two epitaxial layers 20 and 30. Buried layer regions 79 and 89 are formed from the diffused buried n regions.

Refer now to FIG. B which shows the transistors after formation of the p type pnp emitters 35 and 36 and the npn base 34. These regions are formed during a single ion implant or diffusion step.

Refer now to FIG. 9A which shows the devices after formation of the n type npn emitter 39 in the npn base 34. As can be seen from FIG. 9, the pair of npn and pnp transistors use the same substrate 10, use the same epilayers, and are separated conductively by isolation regions 52 and 62.

Turning now to the materials used in fabricating the multicollector pnp transistors, the substrate shown in FIGS. 8 and 9 is a conventional p substrate. The p substrate is typically of a p plus material having a resistivity in the 2-20 ohms per cm range and a thickness the range of 200-400 microns.

The p isolation region buried in the substrate is typically a conventional high concentration p plus material formed by ion implantation in the preferred embodiment.

The n buried region in the p substrate is a conventional n plus material and is formed by ion implantation.

Overlaying these buried regions is a first epitaxial layer which comprises an n material having a thickness determined primarily by the breakdown voltage requirements. A typical value for a medium voltage transistor is a thickness of 4-6 microns and resistivity of 1-2 ohms centimeter. The first epitaxial layer is chosen to be about 50% of the total epitaxial thickness for the embodiments shown in FIG. 8 and FIG. 9.

The p isolation regions formed in the first epitaxial layer are typically p plus regions, are formed by ion implantation, and are similar to the isolation regions formed in the p substrate.

The active collector regions formed within the first epitaxial layer are typically p plus regions and are formed by ion implantation. The isolation regions are typically placed directly above (aligned with) the isolatron regions that were formed in the p substrate.

The collector regions are high concentration regions placed inside two isolation regions. Since the collector regions are formed at the same time as the isolation regions, they should have a very low resistivity. A typical V/I ratio of around 2 to 10 ohms provides a desirable low saturation resistance for the pnp transistor.

The second epitaxial layer placed over the first epitaxial layer is typically an n plus material of 4–6 micron thickness for a typical medium voltage transistor.

The top isolation regions are of the same p plus material as the previous isolation regions, can be formed by ion implantation, and will be located directly over the isolation regions formed in the p substrate and in the first epitaxial layer.

The top collector regions will be disposed directly above the collector regions in the first epitaxial layer and would typically be p plus material formed by ion implantation. The characteristics for the top collector regions will be the same as for a standard isolation diffusion region, i.e., of a very high concentration.

The emitter region of the vertical pnp transistor is diffused/implanted at the same time as the base of the npn transistor and has conventional p type characteristics. No extra steps are required for formation of the pnp emitter. As previously stated, the base of the pnp transistor is formed by the epitaxial layer and is the area between the collector(s) and the emitter(s). The same n+ doping step used to decrease the collector contact resistance for the npn transistor can be used for the pnp base contact.

Referring again to FIG. 9A, there is shown a pnp-npn transistor pair, with the pnp transistor having a multicollector, multiemitter configuration. Shown in FIG. 9A, are isolation regions, an npn transistor, and a vertical multicollector pnp transistor. The npn transistor has an n emitter 39, a p base 34, and an n collector region 59 formed by the epitaxial layers 30 and 20. Underlying the n collector 59 is an n buried region 79 heavily doped to decrease the saturation resistance of the transistor.

Also shown in FIG. 9A is a complementary pnp transistor. The pnp transistor has two vertical collectors 67 and 68, two emitters 35 and 36, and a base 55. In the substrate 10 is a blocking region 89 to block parasitic currents from flowing from the emitters 35 and 36 to substrate 10.

Refer now to FIGS. 9B and 9C which depict vertical collector pnp transistors according to other embodiments of the invention. The embodiment in FIG. 9A is a common emitter, multicollector vertical pnp transistor. The embodiment in FIG. 9C is a common emitter, common collector vertical pnp transistor having multiple collector contacts.

Refer now to FIG. 11. FIG. 11 depicts a top view of an npn-pnp transistor pair such as shown in FIG. 9A. FIG. 11 shows npn transistor 100 and pnp transistor 200 isolated by isolation region 110. Area 105 in npn transistor 100 is covered with an oxide layer from which is exposed metal contact 120 for the np base 125, metal contact 130 for the npn emitter 135, and metal contact 140 for the npn collector. Also shown is pnp transistor 200 having an oxide region 205. As shown in FIG. 11, pnp transistor 200 has collector regions 210 and 220 with metal contacts 215 and 225. Also shown are emitters 230 and 240 having metal contacts 235 and 245. Pnp base contact 260 is also shown.

It can be seen from the foregoing discussion and from FIG. 10 that the preferred embodiment requires two epitaxial layers and two diffusion steps. However, the advantages from utilizing the invention outweigh these additional requirements because the prior art vertical pnp transistor, for example, requires four diffusion steps and results in only one collector. Further analysis shows silicon savings of about 33% occur when two epitaxial layers are used because of lower lateral diffusion of the isolation and collector regions. Thus, the distance between adjacent transistors can be reduced, for example, when the transistors are fabricated in pairs. By tailoring masking to necessary region dimensions and precise region shapes, more precise diffusion can be achieved in the vertical and horizontal directions as compared with the prior art technique. This savings in silicon usage and diffusion permits smaller dimensions and allows enhanced frequency response of the invention at higher frequencies while permitting higher gain. In the embodiment shown in FIG. 9A, the base width is about one-third of the standard base width for standard devices.

It can also be seen that the collector and emitter regions may have a higher p concentration to provide higher gain capability. Because the base region is formed from the low concentration epitaxial layers, higher breakdown voltages are achieved than for the prior art vertical collector transistor taught by Davis and Moyer.

It should be apparent that other embodiments, variations and modifications from the invention may be achieved without varying from the scope thereof. For example, the number of regions and the number of epitaxial layers can be chosen according to design requirements for the semiconductor device. The shape of the regions and the characteristics of the epilayers can also be chosen to further enhance semiconductor device performance. It can also be seen that the invention is not limited to construction of a vertical collector pnp transistor, or to a multicollector pnp transistor, or to transistor pairs. Rather, the invention has application to vertical semiconductor devices in general and customized resistors as well. It is therefore understood that the embodiments disclosed herein are intended to be illustrative only, and not limiting, of the scope of the invention which is set forth in the following claims.

What is claimed is:

1. A method of fabricating a vertical PNP transistor including the steps of:
   providing a P-type substrate;
   forming an N+ buried layer in said P-type substrate;
   forming a first N-type epitaxial layer over said substrate;
   forming a pair of P-type collector regions in said first epitaxial layer above said N+ layer;
   forming a second N-type epitaxial layer over said first N-type epitaxial layer;
   forming a pair of P-type collector contact regions, with smaller, lateral dimensions than said pair of P-type collector regions, in said second epitaxial layer above outside edges of said pair of P-type collector regions for connecting with said pair of P-type collector regions;
   forming a pair of P-type emitter regions between said P-type collector contact regions and above said P-type collector regions; and
   wherein said second N-type epitaxial layer forms a transistor base between said P-type emitter regions and collector regions.

2. The method of claim 1 further comprising the steps of forming P-type isolation regions in said first and second epitaxial layers at the same time as said P-type collector and collector contact regions are formed, and forming P+ isolation regions in said P-type substrate.

3. The method of claim 2 further comprising the step of performing a diffusion, after forming said second epitaxial layer, to interconnect said isolation regions and to cause said P-type collector regions to diffuse upward into said second epitaxial layer to meet said P-type collector contact regions.

* * * * *